United States Patent
Kao et al.

(10) Patent No.: US 10,067,544 B2
(45) Date of Patent: Sep. 4, 2018

(54) HEAT DISSIPATING MODULE

(71) Applicant: Quanta Computer Inc., Taoyuan (TW)

(72) Inventors: Ping-Sheng Kao, Hsinchu (TW);
Jer-Kuang Lu, New Taipei (TW);
Wei-Cheng Liao, New Taipei (TW);
Jih-Sheng Yeh, Taipei (TW)

(73) Assignee: Quanta Computer Inc., Taoyuan (TW)

(*) Notice: Subject to any disclaimer, the term of this patent is extended or adjusted under 35 U.S.C. 154(b) by 145 days.

(21) Appl. No.: 14/659,528

(22) Filed: Mar. 16, 2015

(65) Prior Publication Data
US 2016/0143188 A1 May 19, 2016

(30) Foreign Application Priority Data
Nov. 14, 2014 (TW) .............................. 103139588 A

(51) Int. Cl.
G06F 1/20 (2006.01)
H01L 23/467 (2006.01)
F04D 29/58 (2006.01)
F04D 29/42 (2006.01)
(Continued)

(52) U.S. Cl.
CPC ......... G06F 1/203 (2013.01); F04D 29/4226 (2013.01); F04D 29/441 (2013.01);
(Continued)

(58) Field of Classification Search
CPC ..... H01L 23/3672; H01L 23/467; G06F 1/20; G06F 1/203
(Continued)

(56) References Cited

U.S. PATENT DOCUMENTS 5,484,262 A * 1/1996 Thomas ................ F04D 29/582
165/125
6,043,980 A * 3/2000 Katsui ................... H01L 23/467
165/185
(Continued)

FOREIGN PATENT DOCUMENTS

CN 101155493 A 4/2008
CN 101754640 A 6/2010
(Continued)

OTHER PUBLICATIONS

Watanabe, JPH08008564MT (English Translation), Jan. 1996.*
Yamashita, WO2007007491MT (English Translation), Jan. 2007.*

*Primary Examiner* — Len Tran
*Assistant Examiner* — Eric Ruppert
(74) *Attorney, Agent, or Firm* — Rabin & Berdo, P.C.

(57) ABSTRACT

A heat dissipating module includes a bottom cover, a top cover, a fan body, and a heat dissipating structure. The top cover is disposed opposite the bottom cover, in which an air outlet is formed by the top cover and the bottom cover. The fan body is disposed between the top cover and the bottom cover, and the fan body provides an airflow toward the air outlet. The heat dissipating structure is disposed in front of the air outlet, in which the heat dissipating structure and the bottom cover are formed with a one-piece metal sheet. The heat dissipating structure is bent from the bottom cover toward the air outlet. The heat dissipating structure includes openings, such that the airflow passes through the openings from the air outlet and performs heat exchange with the heat dissipating structure.

2 Claims, 7 Drawing Sheets

(51) Int. Cl.
  *F04D 29/44* (2006.01)
  *H05K 7/20* (2006.01)

(52) U.S. Cl.
  CPC .......... *F04D 29/582* (2013.01); *H01L 23/467* (2013.01); *H05K 7/20154* (2013.01); *H05K 7/20172* (2013.01)

(58) Field of Classification Search
  USPC ................. 165/80.3, 121, 122; 361/695, 697
  See application file for complete search history.

(56) References Cited

U.S. PATENT DOCUMENTS

| | | | |
|---|---|---|---|
| 6,282,091 B1 * | 8/2001 | Horng | G06F 1/20 165/121 |
| 2004/0001316 A1 | 1/2004 | Kamikawa et al. | |
| 2005/0052845 A1 * | 3/2005 | Breier | H05K 5/0213 361/690 |
| 2011/0290452 A1 * | 12/2011 | Tracy | G06F 1/20 165/104.26 |
| 2013/0213617 A1 * | 8/2013 | Chou | F28F 13/12 165/121 |

FOREIGN PATENT DOCUMENTS

| | | | |
|---|---|---|---|
| CN | 103167777 A | | 6/2013 |
| EP | 1845435 A2 | | 10/2007 |
| JP | H08008564 | * | 1/1996 |
| KR | 20010093433 | * | 11/2001 |
| TW | 200903235 A | | 1/2009 |
| TW | M376807 U | | 3/2010 |
| TW | 201311128 A | | 3/2013 |
| TW | 201345403 A | | 11/2013 |
| WO | WO2007007491 | * | 1/2007 |

* cited by examiner

HEAT DISSIPATING MODULE

RELATED APPLICATIONS

This application claims priority to Taiwan Application Serial Number 103139588, filed Nov. 14, 2014, which is herein incorporated by reference.

BACKGROUND

Field of Invention

The present invention relates to a heat dissipating module.

Description of Related Art

To be easy to carry, laptop computers are designed in thinner size and lighter weight. Generally, a forced convection is currently a main cooling mechanism in heat-dissipation of the laptop computers. Concerning a common design of heat sink structure for heat-dissipation, a heat sink array is formed with a stack of metal sheets, for example, copper foils or aluminum foils, and an airflow is guided into the heat sink array. In such design, a wind resistance of the airflow passing through the heat sink array occurs more or less. In addition, concerning the costs, a heat dissipating module not only requires to be even lighter, but also to maintain the heat-dissipation capacity.

SUMMARY

An aspect of the present invention provides a heat dissipating module including a heat dissipating structure with a fin-less design for reducing a wind resistance of an airflow between a fan body and the heat dissipating structure. Therefore, in addition to reducing cost and simplifying manufacture process, the heat dissipating module disclosed in the present disclosure can keep a velocity of the airflow, and the heat-dissipation capacity of the heat dissipating module is maintained.

An aspect of the present invention provides a heat dissipating module including a bottom cover, a top cover, a fan body, and a heat dissipating structure. The top cover is disposed opposite the bottom cover, in which an air outlet is formed by the top cover and the bottom cover. The fan body is disposed between the top cover and the bottom cover, and the fan body provides an airflow toward the air outlet. The heat dissipating structure is disposed in front of the air outlet, in which the heat dissipating structure and the bottom cover are formed with a one-piece metal sheet. The heat dissipating structure is bent from the bottom cover toward the air outlet. The heat dissipating structure includes openings, such that the airflow passes through the openings from the air outlet and performs heat exchange with the heat dissipating structure.

An aspect of the present invention provides a heat dissipating module including a bottom cover and a heat dissipating structure, in which the bottom cover and the heat dissipating structure are formed with a one-piece metal sheet. The heat dissipating module includes the heat dissipating structure with a fin-less design for reducing a wind resistance of an airflow between a fan body and the heat dissipating structure. Therefore, in addition to reducing cost and simplifying manufacture process, the heat dissipating module can keep the velocity of the airflow, and the heat-dissipation capacity of the heat dissipating module is maintained.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
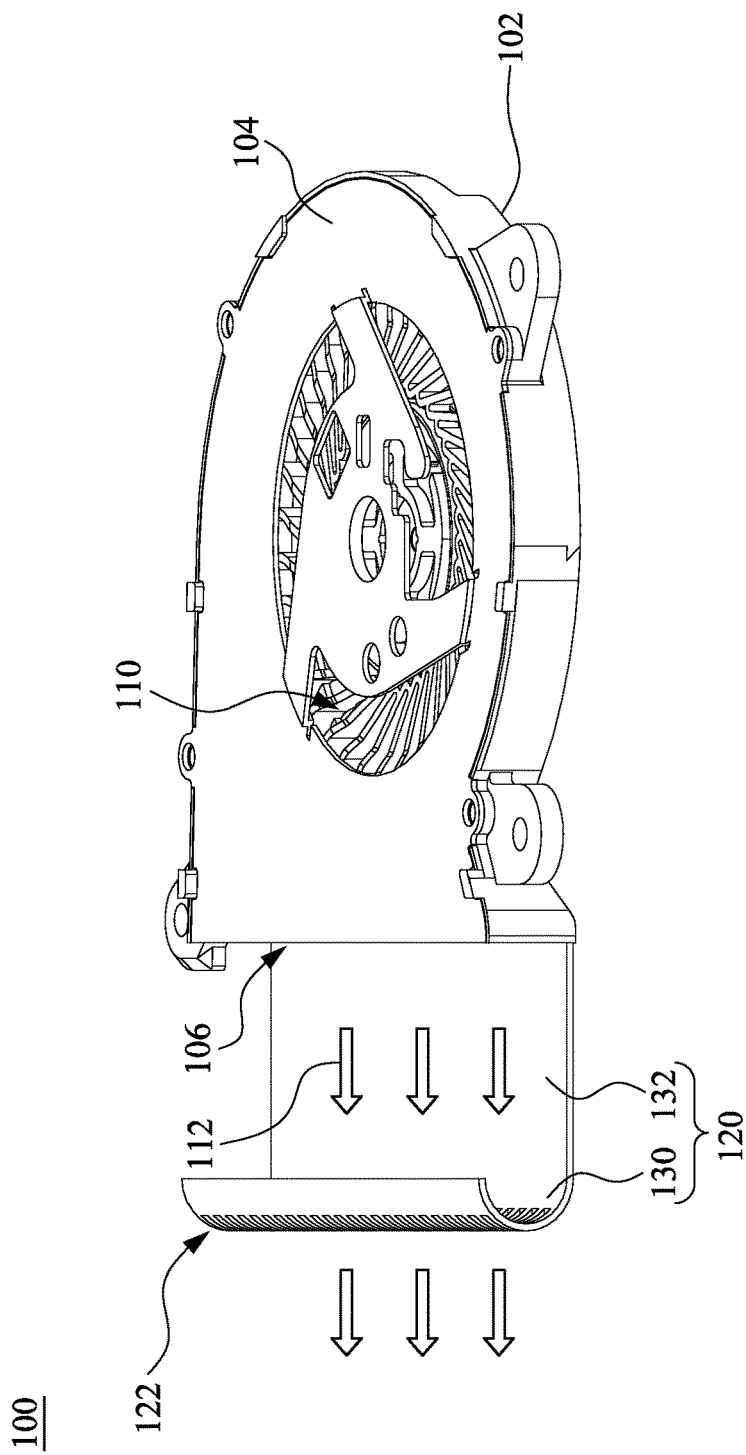
FIG. 1 is an oblique view of a heat dissipating module of the present invention according to a first embodiment.

Reference will now be made in detail to the present embodiments of the invention, examples of which are illustrated in the accompanying drawings. Wherever possible, the same reference numbers are used in the drawings and the description to refer to the same or like parts.

In a conventional fin-type heat sink, a fin array is formed with a stack of metal sheets, and then an airflow flows into the fin array through a side of the fin array. However, a wind resistance of the airflow passing through the fin array is caused to a certain extent. A heat dissipating module of the present invention includes a heat dissipating structure without fin array for reducing a wind resistance of an airflow between a fan body and the heat dissipating structure. Therefore, in addition to reducing cost and simplifying manufacture process, the heat dissipating module can keep the velocity of the airflow for maintaining the heat-dissipation capacity.

Figure 2:
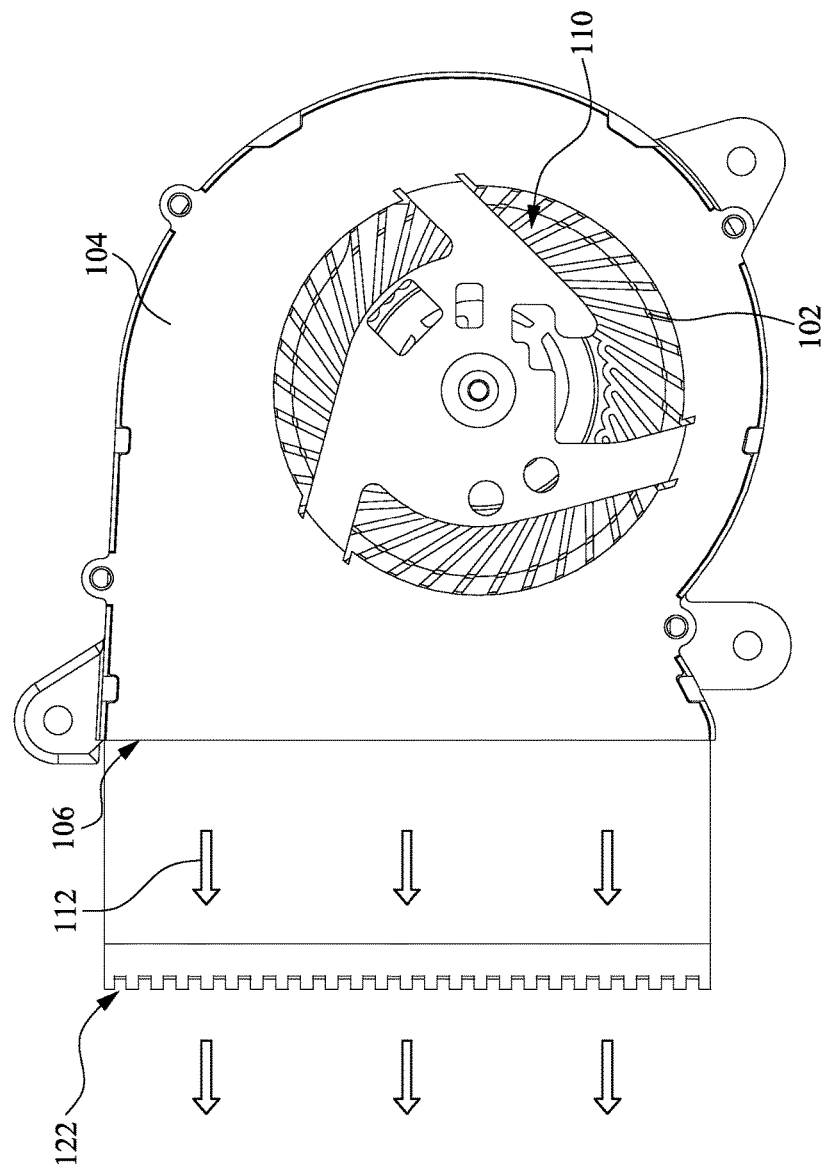
FIG. 2 is a top view of the heat dissipating module in FIG. 1.

FIG. 1 is an oblique view of a heat dissipating module of the present invention according to a first embodiment. FIG. 2 is a top view of the heat dissipating module in FIG. 1. A heat dissipating module 100 includes a bottom cover 102, a top cover 104, a fan body 110, and a heat dissipating structure 120. The top cover 104 is disposed opposite the bottom cover 102, in which an air outlet 106 is formed by the top cover 104 and the bottom cover 102. The fan body 110 is disposed between the top cover 104 and the bottom cover 102, and the fan body 110 provides an airflow 112 toward the air outlet 106. The fan body 110 includes a motor and blades driven by the motor. The heat dissipating structure 120 is disposed in front of the air outlet 106, in which the heat dissipating structure 120 and the bottom cover 102 are formed with a one-piece metal sheet. The heat dissipating structure 120 extends a distance from the bottom cover 102 and is bent toward the air outlet 106. The heat dissipating structure 120 includes openings 122, such that the airflow 112 passes through the openings 122 from the air outlet 106 and performs heat exchange with the heat dissipating structure 120.

The heat dissipating structure 120 and the bottom cover 102 are formed with the same one-piece metal sheet. That is, by bending a portion of the metal sheet before the air outlet 106, the metal sheet is stood in front of the air outlet 106 and the heat dissipating structure 120 is formed, in which the air outlet 106 is formed by portions of the top cover 104 and the bottom cover 102 without sidewalls. Moreover, the bended heat dissipating structure 120 in front of the air outlet 106 is used for receiving the airflow 112 from the air outlet 106.

The heat dissipating module 100 can be disposed in an electronic device. For example, the electronic device is a laptop. In such case, a heat-dissipation method is conducting the heat generated by a thermal source inside the laptop to the heat dissipating structure 120, and then the airflow 112 generated by the fan body 110 performs heat exchange with the heat dissipating structure 120 for bringing heat away.

According one or more embodiments of the present invention, the heat dissipating structure 120 includes a heat dissipating surface 130 and a connecting surface 132. The heat dissipating surface 130 stands in front of the air outlet 106, in which the openings 122 are located at the heat dissipating surface 130. The connecting surface 132 connects the heat dissipating surface 130 to the bottom cover 102.

The heat dissipating surface 130 standing in front of the air outlet 106 is used for receiving the airflow 112, and the airflow 112 performs heat exchange with the heat dissipating surface 130 such that the heat dissipating surface 130 is cooled. The openings 112 on the heat dissipating surface 130 are used for providing the airflow 112 with passing through therein, such that the airflow 112 can be guided to pass through the heat dissipating structure 120. However, a person having ordinary skill in the art may choose a proper scale of the openings 122 as required. For example, when the heat dissipating module 100 is disposed in a laptop, the openings 122 can extend between two opposite sides of the heat dissipating surface 130 or partially extend to the connecting surface 132. In addition, the openings 122 can be disposed along the vertical direction or the horizontal direction.

When the airflow 112 passes through the heat dissipating structure 120, the airflow 112 contacts the heat dissipating structure 120 at an outer edge of each of the openings 122. Therefore, the airflow 112 passing through the heat dissipating structure 120 with a low viscosity, such that the velocity of the airflow 112 is kept after the airflow 112 passes through the heat dissipating structure 120.

According one or more embodiments of the present invention, the heat dissipating surface 130 is a curved surface. Therefore, the airflow 112 is collected to the openings 122 by the curved heat dissipating surface 130. In other words, when the airflow 112 flows into the heat dissipating surface 130, the air flow 112 is guided to enter the openings 122 by the curve of the heat dissipating surface 130. Furthermore, the airflow 112 would not be kept or remained in the heat dissipating structure 120, such that the velocity of the airflow 112 is not reduced by the remained gas.

The heat dissipating module 100 of the present invention can keep the velocity of the airflow 112 by reducing the wind resistance. In addition, the heat dissipating structure 120 and the bottom cover 102 are formed with the one-piece metal sheet, and hence the structure of the heat dissipating module 100 is relative simple. Furthermore, since the heat dissipating structure 120 and the bottom cover 102 are made of the same metal sheet, considering whether the standards of the heat dissipating structure 120 and the bottom cover 102 are suitable or not is unnecessary during a manufacture process of the heat dissipating module 100. When the standards of the heat dissipating structure 120 and the bottom cover 102 are not suitable, the heat dissipating structure 120 in the heat dissipating module 100 may occur an unexpected situation due to loosing or over fastening.

Moreover, since the heat dissipating structure 120 and bottom cover 102 are formed with the same metal sheet, a situation that the elements are damaged by an impact generated by shocking is prevented. In addition, since the heat dissipating structure 120 with openings 122 is a fin-less structure, the heat dissipating structure 120 is convenient to clean such that the heat exchange efficiency can be maintained easily.

In the present embodiment, the heat dissipating structure 120 and bottom cover 102 are made of the same metal sheet, in which the heat dissipating structure 120 is formed by bending a juncture between the heat dissipating surface 130 and the connecting surface 132. In the following embodiments, descriptions are provided with respect to variations of the heat dissipating structure 120, and aspects of the above embodiment that are the same are not described again.

Figure 3:
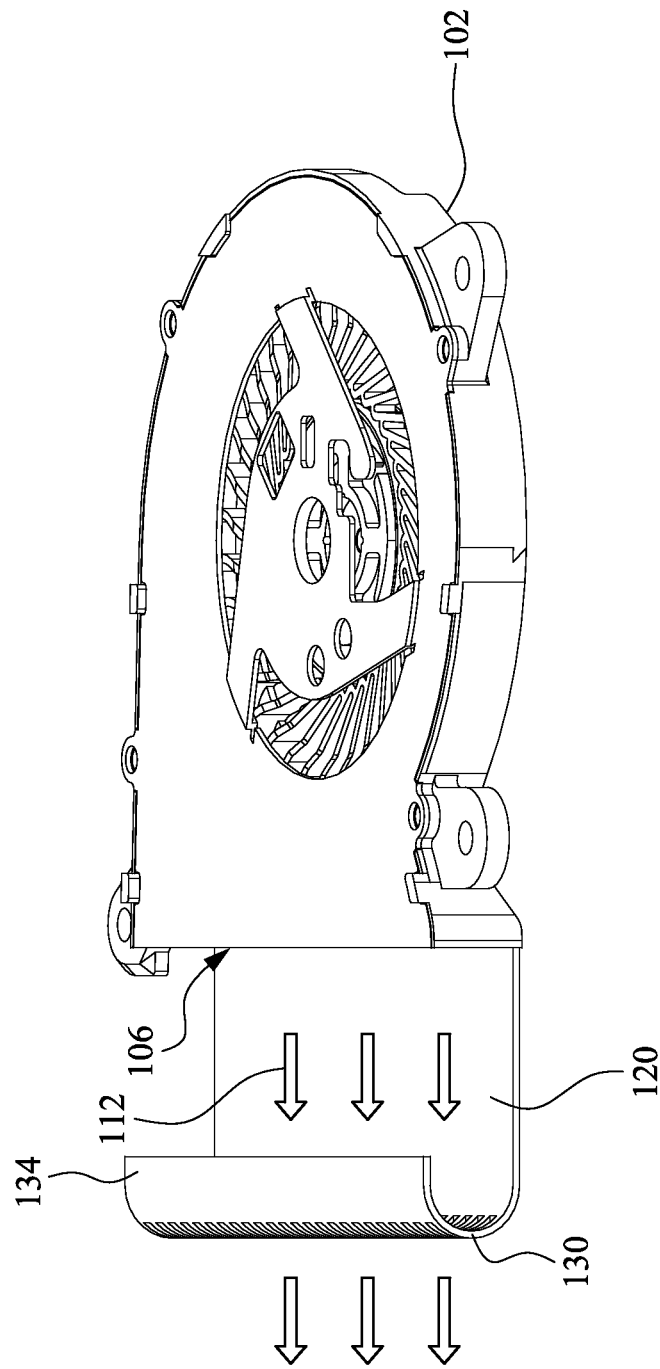
FIG. 3 is an oblique view of a heat dissipating module of the present invention according to a second embodiment.

FIG. 3 is an oblique view of a heat dissipating module of the present invention according to a second embodiment. The difference between this embodiment and the first embodiment is that the heat dissipating structure 120 includes a top surface 134 connected to the heat dissipating surface 130.

In the heat dissipating module 100 of the present invention, the heat dissipating structure 120 includes the top surface 134. The top surface 134 is connected to the heat dissipating surface 130 and is parallel to the bottom cover 102. The top surface 134 can be regards as a plane extending from the heat dissipating surface 130 toward the air outlet 106. Similarly, the top surface 134 collects and guides the airflow 112 to the openings 122, such that the velocity of the airflow 112 would not be reduced due by the remained gas.

In addition, the top surface 134 paralleling the bottom cover 102 can be used for connecting to other elements. When the heat dissipating module 100 is disposed in an electronic device such as a laptop, in order to utilize an inner space of the laptop effectively, the elements are connected to each other by stacking. In the present embodiment, since the heat dissipating module 100 includes the top surface 134, other element can be disposed on and supported by the top surface 134. Furthermore, a channel of the airflow 112 between the air outlet 106 and the heat dissipating surface 130 would not be affected in this configuration.

Figure 4:
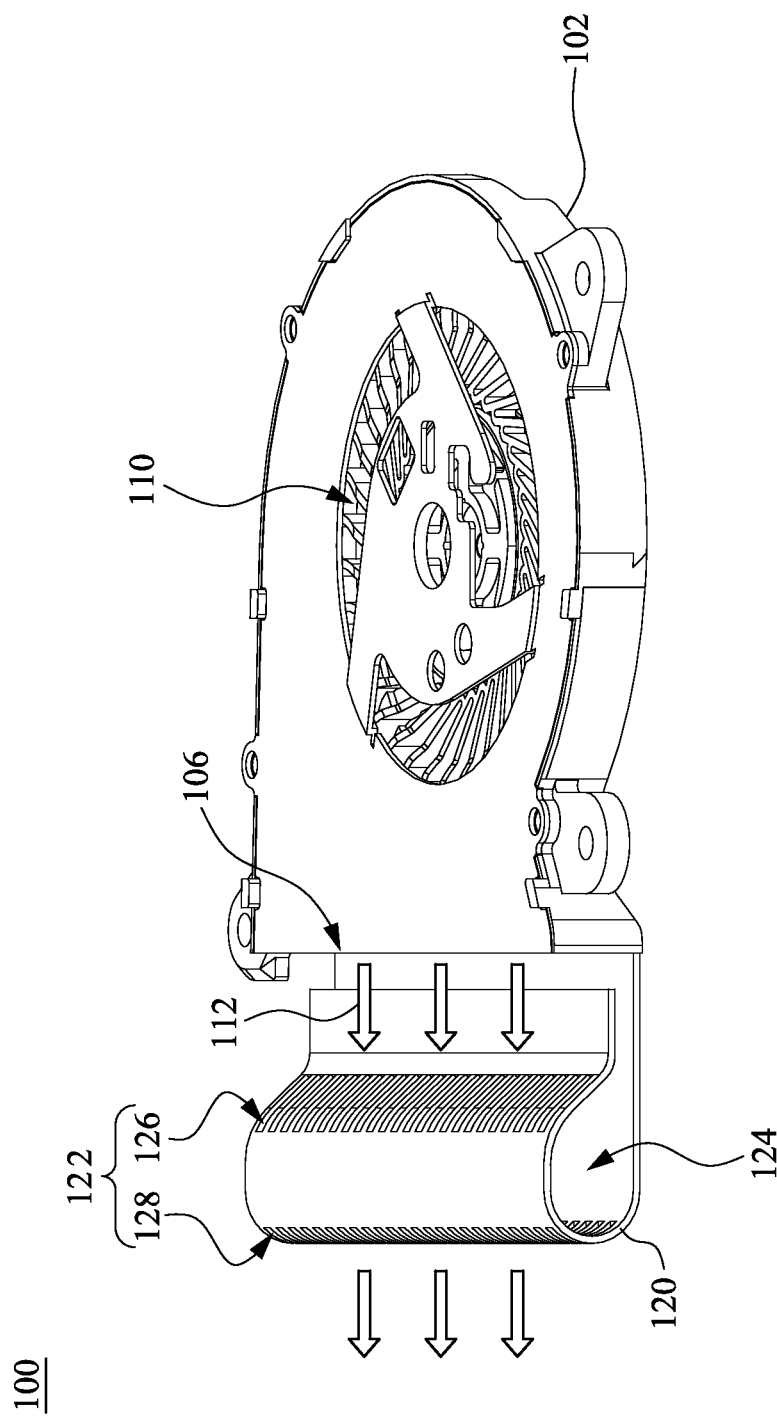
FIG. 4 is an oblique view of a heat dissipating module of the present invention according to a third embodiment.

FIG. 4 is an oblique view of a heat dissipating module of the present invention according to a third embodiment. The difference between this embodiment and the first embodiment is that the heat dissipating structure 120 is a hollow structure with a cavity 124.

In the heat dissipating module 100 of the present invention, the heat dissipating structure 120 extends from the bottom cover 102 and is bent toward the air outlet 106, such that the heat dissipating structure 120 is a hollow structure with the cavity 124. Therefore, the heat dissipating structure 120 includes two opposite surfaces for receiving the airflow 112 from the air outlet 106, in which the openings 122 are arranged on these two opposite surfaces. The openings 122 includes first holes 126 and second holes 128 which are respectively disposed on these two opposite surfaces, and the airflow 112 passes through the first holes 126, the cavity 124, and the second holes 128 from the air outlet 106 in sequence.

In this configuration, since the airflow 112 contacts the heat dissipating structure 120 twice, the number of times of heat exchange between the airflow 112 and the heat dissipating structure 120 is increased such that the airflow 112 can bring more heat away from the heat dissipating structure 120. Furthermore, when the airflow 112 passes through the heat dissipating structure 120, the airflow 112 contacts the heat dissipating structure 120 at the outer edges of the openings 122. Therefore, the velocity of the airflow 112 can be kept to a certain extent, and the airflow 112 would not be remained in the cavity 124.

In addition, the heat dissipating structure 120 with the hollow structure also guides the airflow 122 for preventing the airflow 122 from diverging, as used herein, "preventing the airflow 122 from diverging" means the flowing direction of the airflow 122 is kept steady. That is, the airflow 122 flows into heat dissipating structure 120 with entering the first holes 126, and flows out the dissipating structure 120 from the second holes 128. Therefore, under the steady flowing direction, the configuration of the heat dissipating structure 120 of the present embodiment uniformizes the velocity of the airflow 122 provided by the fan body 110.

Figure 5:
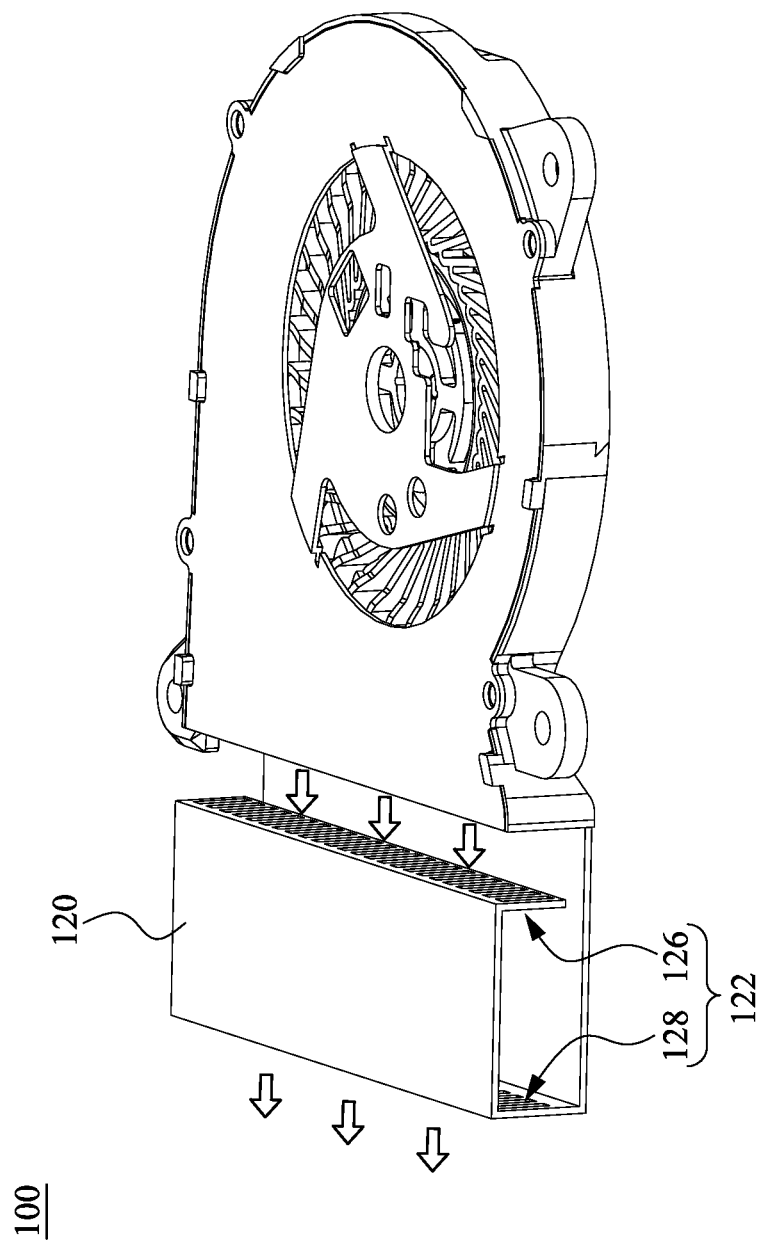
FIG. 5 is an oblique view of a heat dissipating module of the present invention according to a fourth embodiment.

FIG. 5 is an oblique view of a heat dissipating module of the present invention according to a fourth embodiment. The difference between this embodiment and the third embodiment is that a cross-section of the heat dissipating structure 120 is rectangular.

In the heat dissipating module 100 of the present embodiment, a cross-section of the heat dissipating structure 120 is a rectangle. As described previously, when the heat dissipating module 100 needs to connect to other elements by stacking, the rectangular heat dissipating structure 120 can support other elements.

However, a person having ordinary skill in the art may choose a proper scale of the openings 122 (or area of the openings 122) as required. For example, in the third or the fourth embodiment, the first holes 126 and the second holes 128 are connected to each others such that the heat dissipating structure 120 is penetrated by the openings 122. In addition, the first holes 126 and the second holes 128 adjusted to arrange along the horizontal direction are also allowable.

Figure 6:
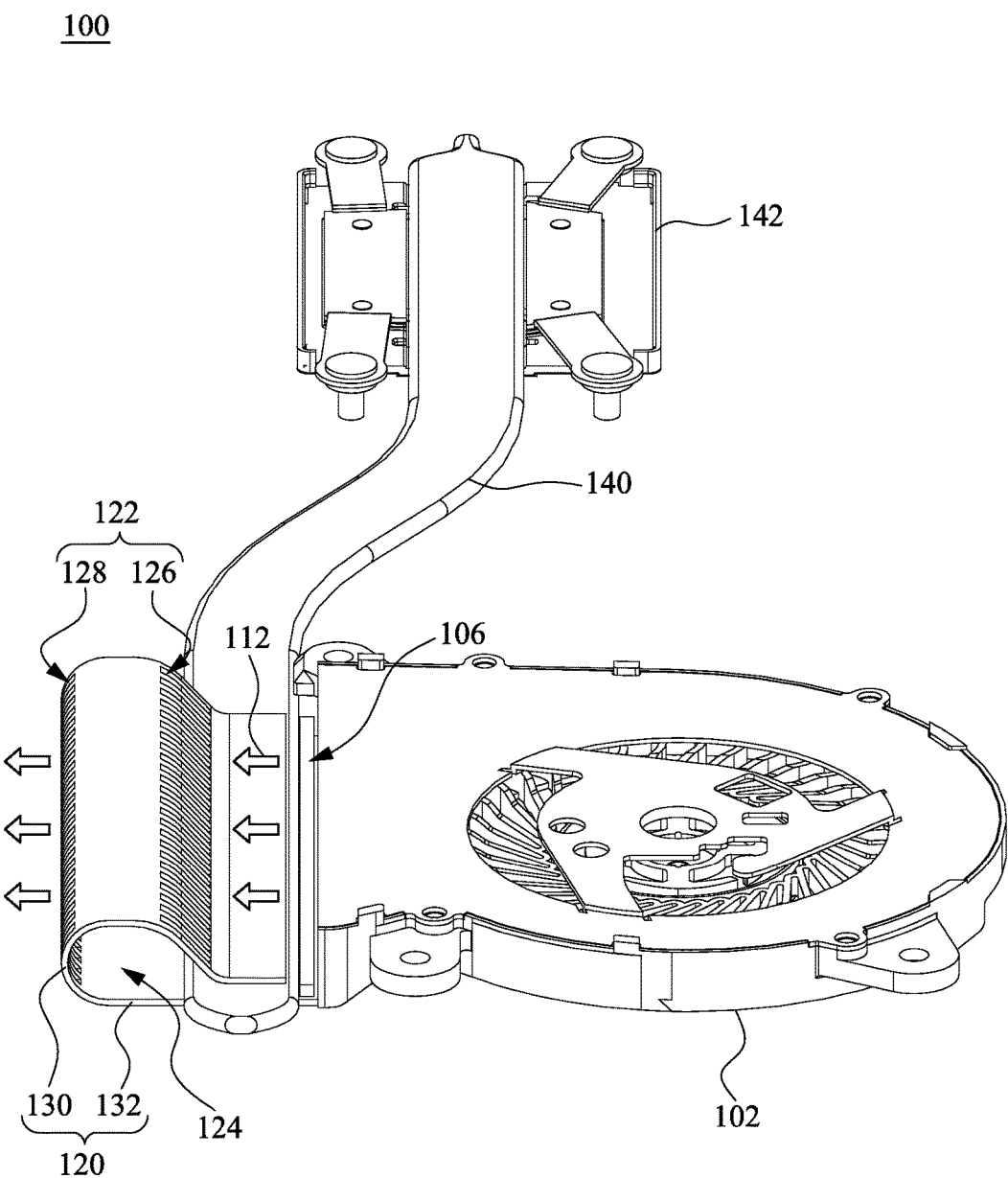
FIG. 6 is an oblique view of a heat dissipating module of the present invention according to a fifth embodiment.
Figure 7:
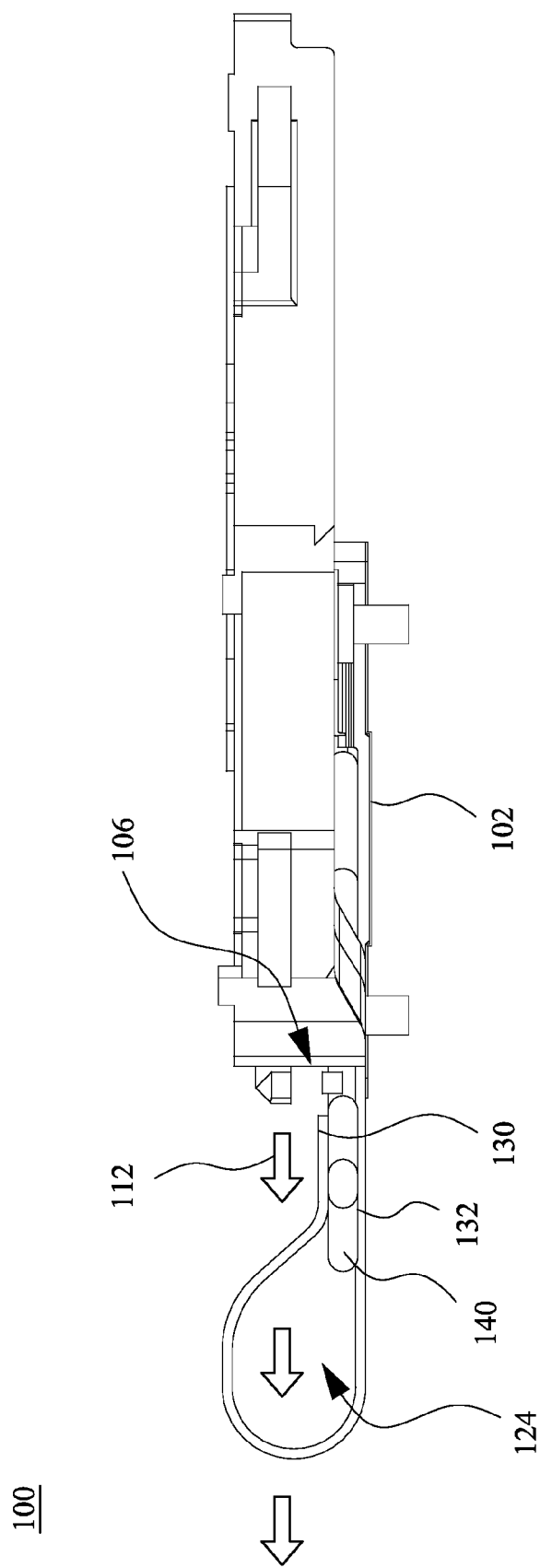
FIG. 7 is a side view of the heat dissipating module in FIG. 6.

FIG. 6 is an oblique view of a heat dissipating module of the present invention according to a fifth embodiment, and FIG. 7 is a side view diagram of the heat dissipating module in FIG. 6. As shown in FIG. 6 and FIG. 7, the difference between this embodiment and the third embodiment is that the heat dissipating module 100 further includes a heat pipe 140 connecting a heat sink 142 to the heat dissipating structure 120, in which the heat sink 142 is connected to a thermal source.

In some embodiments, the heat dissipating module 100 further includes the heat pipe 140 connecting a heat sink 142 to the heat dissipating structure 120, in which the heat pipe 140 is made of a thermally conductive material, for example, a solid tube made of metal or a pipe with filling a thermally conductive material therein. Furthermore, the thermal source can be a central processing unit (CPU). The thermal source generates heat during working, and the heat pipe 140 is used for bringing the heat generated from the thermal source away and transmitting the heat from the heat sink 142 to the heat dissipating structure 120.

As described previously, the heat dissipating structure 120 includes the connecting surface 132 and the heat dissipating surface 130. In the present embodiment, the connecting surface 132 is connected to the bottom cover 102. Furthermore, the connecting surface 132 extends from the bottom cover 102, and the heat pipe 140 is disposed on the connecting surface 132. The heat dissipating surface 130 is connected to a side of the connecting surface 132 opposite the bottom cover 102 and the heat pipe 140, such that the heat dissipating structure 120 is the hollow structure with the cavity 124. The openings 122 are located on the heat dissipating surface 130, such that the airflow 112 passes through the openings 122 from the air outlet 106 and performs heat exchange with the heat dissipating structure 120. In addition, the openings 122 includes the first holes 126 and the second holes 128, such that the number of times of heat exchange between the heat dissipating structure 120 and the air flow 112 is increased.

In this configuration, the heat of the heat sink 142 is conducted to the heat dissipating surface 130 and the connecting surface 132 by the heat pipe 140 contacting with the connecting surface 132. In some embodiments, two opposite surfaces of the heat pipe 140 are respectively covered with the connecting surface 132 and the heat dissipating surface 130, such that the heat pipe 140 is sandwiched by the connecting surface 132 and the heat dissipating surface 130 of the heat dissipating structure 120. With this configuration, the heat pipe 140 can contact with the heat dissipating surface 130 with a greater heat dissipating area, such that the area between the heat pipe 140 and the heat dissipating structure 120 is increased.

As described above, the heat dissipating module includes the bottom cover and the heat dissipating structure, in which the bottom cover and the heat dissipating structure are formed with a one-piece metal sheet. The heat dissipating structure is formed in front of the air outlet by bending the metal sheet, in which the openings are disposed on the heat dissipating structure such that the airflow can pass through the heat dissipating structure from the air outlet. Therefore, the airflow performs heat exchange with the heat dissipating structure for cooling the heat dissipating structure. With this configuration, the manufacture process of the heat dissipating module is simplified, and the manufacture cost is also reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A heat dissipating module, comprising:
   a bottom cover;
   a top cover disposed opposite the bottom cover such that the bottom cover is in a portion lower than a position of the top cover, wherein an air outlet is formed by the top cover and the bottom cover;
   a fan body disposed between the top cover and the bottom cover and providing an airflow toward the air outlet; and
   a heat dissipating structure disposed in front of the air outlet, wherein the heat dissipating structure and the bottom cover are formed with a one-piece metal sheet, and the heat dissipating structure is bent from the bottom cover toward the air outlet and comprises a plurality of openings, such that the airflow passes through the openings from the air outlet and performs heat exchange with the heat dissipating structure, wherein the heat dissipating structure further comprises:
      a heat dissipating surface standing in front of the air outlet, wherein the heat dissipating surface is curved and has an arched portion, the openings are located at the heat dissipating surface and each of the openings is fully in a position lower than a position of the arched portion, and each of the openings has a closed outline with a lengthwise side that is wholly curved along the curved heat dissipating surface, and the closed outline is separated from at least one edge of the heat dissipating surface by the arched portion; and a connecting surface connecting the heat dissipating surface to the bottom cover, wherein the connecting surface is in a position lower than the position of the arched portion.

2. A heat dissipating module, comprising:

a bottom cover;

a top cover disposed opposite the bottom cover such that the bottom cover is in a portion lower than a position of the top cover, wherein an air outlet is formed by the top cover and the bottom cover;

a fan body disposed between the top cover and the bottom cover and providing an airflow toward the air outlet; and a heat dissipating structure disposed in front of the air outlet, wherein the heat dissipating structure and the bottom cover are formed with a one-piece metal sheet, and the heat dissipating structure is bent from the bottom cover toward the air outlet and comprises a plurality of openings, such that the airflow passes through the openings from the air outlet and performs heat exchange with the heat dissipating structure, wherein the heat dissipating structure further comprises:

a heat dissipating surface standing in front of the air outlet, wherein the heat dissipating surface is curved and has a first arched portion and a second arched portion which is in a position lower than a position of the first arched portion, all of the openings are located at the heat dissipating surface and between the first and second arched portions, and each of the openings has a closed outline with a lengthwise side that is wholly curved along the curved heat dissipating surface, and the closed outline is separated from at least one edge of the heat dissipating surface by the first arched portion; and a connecting surface connecting the heat dissipating surface to the bottom cover.

* * * * *